United States Patent [19]

Crosson et al.

[11] 4,152,286

[45] May 1, 1979

[54] COMPOSITION AND METHOD FOR FORMING A DOPED OXIDE FILM

[75] Inventors: Carol A. Crosson, Garland; Terry L. Brewer; Robert F. Aycock, both of Plano, all of Tex.

[73] Assignee: Texas Instruments Incorporated, Dallas, Tex.

[21] Appl. No.: 832,857

[22] Filed: Sep. 13, 1977

[51] Int. Cl.$^2$ .............................................. H01L 7/44
[52] U.S. Cl. .................................... 252/182; 148/188; 252/950; 427/85
[58] Field of Search ......................... 148/188; 427/85; 252/950, 182

[56] References Cited

U.S. PATENT DOCUMENTS 3,915,766  10/1975  Pollack et al. ..................... 148/188
3,928,225  12/1975  Schafer ............................... 427/85

Primary Examiner—M. J. Andrews
Attorney, Agent, or Firm—James T. Comfort; Gary C. Honeycutt

[57] ABSTRACT

A boron doped, silicon oxide-forming film is produced on a semiconductor wafer by coating the wafer with a solution of a silicon compound and a boron compound, in a blend of two polar organic solvents, one of which has a low boiling point, and the other has a high boiling point, between 185° and 300° C. During a subsequent heating step, the high boiling point solvent redissolves any crystalline precipitate that forms during spin-on, giving a more uniform film for diffusion, and consequently a damage-free wafer surface.

8 Claims, No Drawings

COMPOSITION AND METHOD FOR FORMING A DOPED OXIDE FILM

This invention relates to the fabrication of semiconductor devices, and more particularly to methods for the solid-state diffusion of conductivity-type impurities from a doped silicon oxide film into a semiconductor wafer. Specifically, novel compositions are formulated for use in coating a semiconductor wafer to provide a doped silicon oxide film that serves as a source of dopant for solid-state diffusion.

The use of a doped oxide film as a source of impurity for solid-state diffusion in the fabrication of semiconductor devices has been known for many years. In theory, the doped oxide source provides improved control over dopant concentration, more uniform distribution of dopant concentrations, and the ability to simultaneously diffuse both n-type and p-type impurities in a single step. As a practical matter, however, these advantages have not been generally achieved by the industry, perhaps due to insufficient economic incentive, and also due to the lack of a convenient, low-temperature technique for the formation of doped oxide film.

A stable solution of ingredients which yield a doped oxide film has recently been developed. (See U.S. Pat. No. 3,915,766.) Although the patented formulation is stable, pure, and reproducible from batch to batch, it has been found that the dopant species may to some extent form a crystalline precipitate during the spin-on step, or shortly thereafter; and that such a precipitate can lead to localized damage of the wafer surface.

Accordingly, it is an object of the present invention to formulate a doped oxide-forming composition that can be applied to a semiconductor surface, without a significant precipitation of any dopant species therefrom. More specifically, it is an object of the invention to formulate a doped oxide-forming composition wherein the solvent is a blend, one component of which is inherently capable of redissolving any dopant that may precipitate on the wafer surface at the time of spin-on or thereafter.

It is a further object of the invention to provide an improved solid-state diffusion process using the compositions of the invention.

One aspect of the invention is embodied in a composition comprising a blend of first and second polar organic solvents having a silicon oxide-forming compound and a boron compound dissolved therein. The first solvent has a boiling point of 50° to 150° C. and constitutes about 60% to 90% by weight of the total composition. The second solvent has a boiling point between 185°–300° C. and constitutes about 0.5% to 30% of the composition. For example, a preferred solvent blend includes 2-ethoxyethanol (cellosolve), boiling at 135° C., and dimethylphthalate boiling at 282° C., in a ratio of about 13:1, respectively.

The preferred composition also includes boron oxide ($B_2O_3$) as the dopant species, and a silicon oxide-forming compound prepared by reacting tetraethylorthosilicate with acetic anhydride, which yields an equilibrium mixture of ethylacetate, triethoxysilicon acetate and diethoxysilicon diacetate.

Other solvents which may be substituted for ethoxyethanol include lower alcohols, such as ethanol; lower ketones, including acetone and methyl ethyl ketone; and alkyl ethers, such as ethyl ether and methyl ethyl ether, in addition to other alkoxyalcohols, such as methoxyethanol.

Other solvents that may be substituted for dimethylphthalate include other aromatic esters, such as lower alkyl phthalates, i.e., methyl ethyl phthalate, diethyl phthalate and dipropyl phthalate; lower alkyl isophthlates, such as diethylisophthilate; and salicylates, such as ethyl salicylate, methyl salicylate and isoamyl salicylate.

The conductivity type-determining dopant for diffusion in silicon is generally selected from boron, phosphorous, and arsenic. Gold is also a useful dopant for lifetime control. These dopants are preferably added to the compositions of the invention in the form of boron oxide, orthophosphoric acid, orthoarsenic acid, and gold chloride, respectively. Other dopant species are useful, with essentially equivalent results. Zinc chloride is a suitable source of zinc for diffusion in gallium arsenide.

The compositions of the invention include about 60% to 90% by weight solvent, and a ratio of silicon atoms to dopant atoms of about 1.5:1 up to about 6:1, depending primarily upon the doping level required in the semiconductor. The molar ratio of acetic anhydride to tetraethylorthosilicate added is about 1.5:1 up to 3:1, and preferably about 2.0:1 up to 2.3:1.

The compositions of the invention are preferably prepared by refluxing acetic anhydride, tetraethylorthosilicate and the appropriate dopant in the low-boiling solvent for 2 to 12 hours, and preferably from 4 to 10 hours, with stirring. In order to minimize the amount of moisture entering the system, the reflux condenser should be attached to a drying tube. After the reflux period the solution is cooled and the high-boiling solvent is added to complete the preparation of the composition.

The ratio of the solvent blend to the remaining ingredients determines the eventual thickness of the film obtained upon application to the semiconductor wafer. For example, a blend of 350 ml. 2-ethoxyethanol and 21 ml. dimethylphthalate having dissolved therein 4.38 grams of $B_2O_3$ and the reaction product of 40 ml. tetraethylorthosilicate and 35 ml. acetic anhydride yields a film approximately 1200 angstroms thick.

When the compositions are applied to a semiconductor surface by spinning, spraying or dipping, solvent evaporation causes the formation of a doped silicon polymer film which is readily converted to doped silicon oxide by heating at a temperature as low as 200° C. to drive off volatile by-products, residual solvent and any water which remains. Subsequent heating to diffusion temperatures of about 1100° C., for example, causes dopant to pass from the oxide film into the semiconductor, as will be readily appreciated by one skilled in the art. Initial heating at a low temperature is optional; the slices may be placed directly in a diffusion furnace after spin-on.

The preferred method of application is by spinning, which is conveniently accomplished with the use of photoresist spin-coating equipment, an example of which is model 6604 of Industrial Modular Systems Corporation of Cupertino, California. A proper selection of spin rate will determine the thickness of the resulting film, which also depends upon the initial solution viscosity.

Data supporting and demonstrating the advantages of the invention are set forth in the following examples.

1. A boron dopant solution is prepared by mixing 4.38 gm B$_2$O$_3$, ml. 2-ethoxyethanol, 40 ml. tetraethylorthosilicate, and 35 ml. of acetic anhydride in a 1000 ml. round bottom flask. The solution is then refluxed and stirred for 8 hours at approximately 120° C. After the reaction mix cools, it is filtered with a 0.1μ teflon filter. Then 21 ml. of dimethyl phthalate are added.

To obtain diffusion results, the boron dopant composition is applied to clean 4 ohm-cm, N-type silicon slices at 3000 rpm spin-speed for 10 seconds. Slices are then placed in a diffusion furnace for 180 minutes at 1100° C. in 99% N$_2$, 1% O$_2$ gas flow.

a. Results after diffusion: 5.1 ohms per square sheet resistivity 3.50 microns to 4.0 microns junction depth 1.7×10$^{20}$ Boron atoms per cc b. Stability with changes in relative humidity: Damage-free surface with each run

| Relative Humidity | $\overline{R_s}$ Ω/□ |
|---|---|
| 28% | 5.0 |
| 30% | 5.2 |
| 34% | 5.1 |
| 35% | 5.0 |
| 46% | 5.5 |
| 48% | 4.9 |
| 50% | 5.2 | c. Stability with age (shelf-life) Damage free surface with each run.

Run #1 resulting in 5.1 ohms per square after 43 days.
Run #2 resulting in 4.8 ohms per square after 80 days.

d. Lot to lot reproducibility: Damage-free surface in all cases

| Lot # | $\overline{R_s}$ Ω/□ |
|---|---|
| I | 4.9 |
| II | 5.0 |
| III | 5.2 |
| IV | 5.2 |

Calculated mean value of all Rs readings is 5.09 Ω/□
Calculated standard deviation is 0.16827

2. A boron dopant solution is prepared by mixing 4.38 gm B$_2$O$_3$, 350 ml. methoxyethanol, 40 ml. tetraethylorthosilicate, and 35 ml. of acetic anhydride in a 1000 ml. round bottom flask. The solution is then refluxed and stirred for 8 hours at approximately 130° C. After reaction mix cools, filter with 0.1μ teflon filter. Then add 21 ml. of dimethyl phthalate.

3. A boron dopant solution is prepared by mixing 4.38 gm B$_2$O$_3$, 350 ml 2-ethoxyethanol, 40 ml. tetraethylorthosilicate, and 35 ml. of acetic anhydride in a 1000 ml. round bottom flask. The solution is then refluxed and stirred for 8 hours at approximately 130° C. After reaction mix cools, filter with 0.1μ teflon filter. Then add 21 ml. of diethyl phthalate.

4. A boron dopant solution is prepared by mixing 4.38 gm B$_2$O$_3$, 350 ml. methoxyethanol, 40 ml. tetraethylorthosilicate, and 35 ml. of acetic anhydride in a 1000 ml. round bottom flask. The solution is then refluxed and stirred for 8 hours at approximately 130° C. After reaction mix cools, filter with a 0.1μ teflon filter. Then add 21 ml. of diethyl phthalate.

What is claimed is:

1. A composition comprising a blend of first and second polar organic solvents, a silicon oxide-forming compound and a dopant compound dissolved therein; said first solvent having a boiling point of 50°–150° C. and comprising about 60% to 90% by weight of said composition; said second solvent comprising an alkyl ester of an aromatic acid, having a boiling point of 185°–300° C. and comprising about 0.5% to 30% by weight of said composition.

2. A composition as in claim 1 wherein said first solvent is an alkoxyalcohol.

3. A composition as in claim 1 wherein said first solvent is ethoxyethanol.

4. A composition as in claim 1 wherein said second solvent is a dialkyl phthalate.

5. A composition as in claim 1 wherein said silicon oxide-forming compound is a reaction product of tetraethylorthosilicate and acetic anhydride.

6. A composition as in claim 1 wherein said dopant compound is boron oxide.

7. A composition as in claim 1 wherein said first solvent is ethoxyethanol, said second solvent is diethylphthalate, and said dopant is a boron compound.

8. A compound as in claim 7 wherein said boron compound is B$_2$O$_3$ and said silicon oxide-forming compound is a product obtained by reacting acetate anhydride with tetraethylorthosilicate.

* * * * *